(12) United States Patent
Bu et al.

(10) Patent No.: US 7,795,122 B2
(45) Date of Patent: Sep. 14, 2010

(54) ANTIMONY ION IMPLANTATION FOR SEMICONDUCTOR COMPONENTS

(75) Inventors: Haowen Bu, Plano, TX (US); Amitabh Jain, Allen, TX (US); Srinivasan Chakravarthi, Murphy, TX (US); Shashank S. Ekbote, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 593 days.

(21) Appl. No.: 11/725,927

(22) Filed: Mar. 20, 2007

(65) Prior Publication Data

US 2007/0218662 A1 Sep. 20, 2007

Related U.S. Application Data

(60) Provisional application No. 60/784,136, filed on Mar. 20, 2006.

(51) Int. Cl.
 *H01L 21/425* (2006.01)
(52) U.S. Cl. .................. 438/530; 438/525; 257/607; 257/E21.147
(58) Field of Classification Search .......... 438/525, 438/528, 530; 257/607, E21.147
 See application file for complete search history.

(56) References Cited

U.S. PATENT DOCUMENTS

| | | | |
|---|---|---|---|
| 6,323,519 B1 * | 11/2001 | Gardner et al. ............. 257/336 | |
| 6,642,122 B1 | 11/2003 | Yu | |
| 6,680,233 B2 * | 1/2004 | Yu et al. ..................... 438/303 | |
| 6,797,593 B2 | 9/2004 | Chakravarthi et al. | |
| 6,893,930 B1 | 5/2005 | Yu et al. | |
| 2004/0053481 A1 * | 3/2004 | Chakravarthi et al. ........ 438/514 |
| 2004/0248351 A1 * | 12/2004 | Ito et al. ..................... 438/197 |
| 2005/0062388 A1 * | 3/2005 | Camm et al. ............ 313/231.71 |
| 2006/0017079 A1 * | 1/2006 | Chakravarthi et al. ........ 257/288 |
| 2007/0212861 A1 * | 9/2007 | Chidambarrao et al. ..... 438/530 |

* cited by examiner

*Primary Examiner*—Zandra Smith
*Assistant Examiner*—Christy L Novacek
(74) *Attorney, Agent, or Firm*—Warren L. Franz; Wade J. Brady, III; Frederick J. Telecky, Jr.

(57) ABSTRACT

A method is disclosed for implanting and activating antimony as a dopant in a semiconductor substrate. A method is also disclosed for implanting and activating antimony to form a source/drain extension region in the formation of a transistor, in such a manner as to achieve high activation and avoid deactivation via subsequent exposure to high temperatures. This technique facilitates the formation of very thin source/drain regions that exhibit reduced sheet resistance while also suppressing short channel effects. Enhancements to these techniques are also suggested for more precise implantation of antimony to create a shallower source/drain extension, and to ensure formation of the source/drain extension region to underlap the gate. Also disclosed are transistors and other semiconductor components that include doped regions comprising activated antimony, such as those formed according to the disclosed methods.

23 Claims, 6 Drawing Sheets

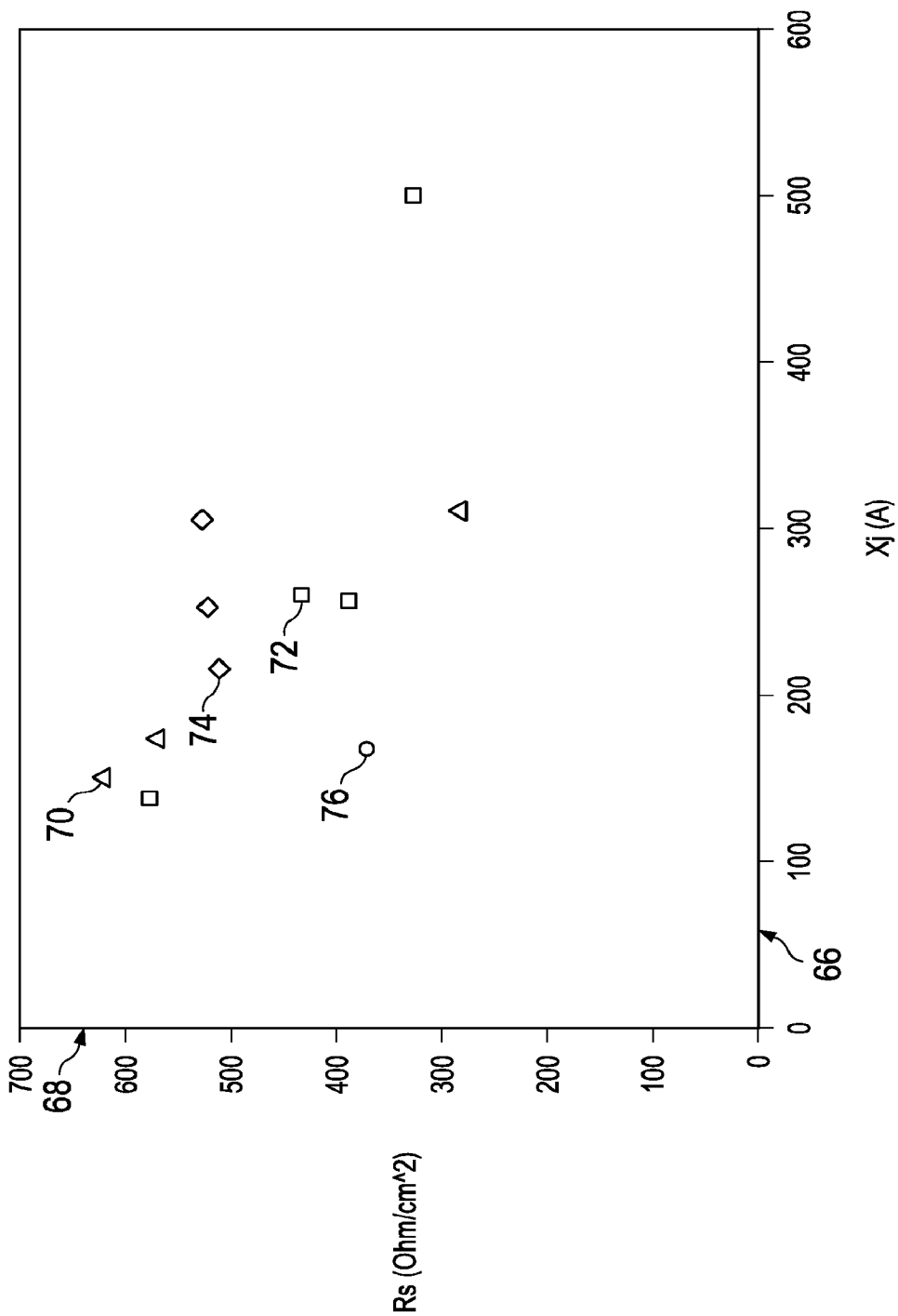

ANTIMONY ION IMPLANTATION FOR SEMICONDUCTOR COMPONENTS

RELATED APPLICATIONS

This application claims the benefit of the priority date of U.S. patent application No. 60/784,136, filed Mar. 20, 2006, the contents of which are incorporated by reference as if fully rewritten herein.

FIELD

The present disclosure relates generally to the field of semiconductor component fabrication, and more particularly to the implantation and activation of antimony as a semiconductor dopant, including methods of implanting and activating this dopant and components that incorporate this dopant.

BACKGROUND

The present disclosure relates generally to the field of semiconductor fabrication. In conventional practice, semiconductor fabrication begins with the provision of a semiconductor wafer, comprising silicon formed in a regular, crystalline structure. A circuit pattern is devised in which regions of the semiconductor wafer are intended to support NMOS and PMOS semiconductor components. These regions are isolated from each other with the formation of electronically inert isolation trenches. Each region is then doped with a type of dopant opposite the electronic nature of the components to be created thereupon. The formation of the electronic components then occurs upon this semiconductor wafer, and typically involves doping the electronically active areas of the semiconductor wafer with the desired type of dopant. For instance, NMOS components are formed by implanting a p-type dopant in a region of the semiconductor, and then forming the components by implanting an n-type dopant in order to create the electronically active regions of the NMOS component. Each dopant is exposed to a thermal anneal, which restores the crystalline lattice structure of the semiconductor wafer (since the physical injection of ions can disrupt the crystalline lattice), and also electronically "activate" the dopant ions by positioning them within the same lattice structure. The components may then be connected through a metallization step, in which metal paths are formed to connect the electronically active areas of the components into a fully interconnected circuit.

It will be appreciated that the implantation of a dopant is a key step in semiconductor component fabrication. For many semiconductor components, the characteristics of doping, such as the choice of dopant, the implant method, and the resulting concentration and area of the dopant, dopant concentration vertical and lateral gradient, bear critically on the resulting performance and reliability of the components. One implant scenario that requires specific implanting is in the formation of source/drain regions of a MOSFET transistor. A typical transistor comprises two electronically active areas that serve as the source and drain regions of the transistor, which are bridged by a conductive gate. When the gate is powered above a certain threshold voltage, a conductive channel is formed between the source and drain regions to close the circuit; but when the gate is unpowered, the channel resists such electronic flow. In this context, the characteristics of the source/drain region doping bear directly on the threshold voltage of the gate and the resistance of the channel in powered and unpowered states. If the dopant concentration is too low or if the source and drain are too distant, the threshold voltage will be undesirably high. If the dopant concentration is too high or if the source and drain regions are too close, the threshold voltage will be undesirably low, and the resistance in the unpowered state may be insufficient to prevent electron flow. In this latter case, the effects that permit an undesired activation of the transistor are generally referred to as "short channel effects."

One method of preventing short channel effects is by modifying the design of the source/drain regions to feature a source/drain extension region. In this design, the source and drain regions are deposited a small distance away from the gate structure, so that both regions feature a small gap exists between the electronically active region and the gate. This gap is then lightly and shallowly doped to form an "extension" of the electronically active region. In contrast with non-extended source/drain implants, these extensions serve as a comparatively thin and less conductive interface between the source/drain region and the gate, thereby desirably raising the threshold voltage of the gate and the resistance of the transistor channel while the gate is unpowered. The resulting transistor therefore exhibits higher predictability and enhanced performance.

The concepts described hereinabove are illustrated in FIG. 1, which presents a side-elevation view in section of a portion of a conventional semiconductor. In this figure, the semiconductor 10 comprises a silicon wafer 12, an area of which is designated to support either n-type or p-type electronic components. For an area intended to support NMOS components, the semiconductor substrate (an upper layer 14 of the silicon wafer 12) is doped with a p-type dopant, which will electronically insulate the NMOS components to be fabricated thereupon. Conversely, for an area intended to support PMOS components, the semiconductor substrate 14 is doped with an n-type dopant, which will electronically insulate the PMOS components to be fabricated thereupon. The area may also be electronically insulated from nearby structures by the formation of one or more isolation structures 16, such as a local oxidation of silicon (LOCOS) structure or an isolation trench. To form an electronic component like a transistor, the gate structure is first formed, comprising, in one common design, a thin layer of dielectric material 18 over which is formed a polysilicon layer 20. Next, areas 22 of the semiconductor substrate 14 on each side of the gate structures 18, 20 are lightly and shallowly doped with a dopant of the same type as the components to be formed (e.g., a p-type dopant for PMOS components, or an n-type dopant for NMOS components.) These lightly and shallowly doped areas 22 will function as the source/drain extension regions of the transistor. After this implantation, the semiconductor 10 is exposed to a high-temperature anneal, which "activates" the dopant ions implanted in the lightly-doped source/drain extension regions 22 by causing them to migrate into the crystalline structure of the silicon wafer 12, and also restores the regular lattice configuration of the silicon wafer 12 for consistent electronic flow. After this anneal, sidewall spacers 24 are formed over the sidewall spacer regions 22. The regions 26 of the semiconductor substrate 14 adjacent to the gate structures 18, 20 and the sidewall spacers 24 is then heavily doped with a dopant of the same type as the components to be formed. The regions 26 will function as the source and drain regions of the transistor. A second anneal step is then performed to activate the dopant ions implanted in the source/drain regions, for the reasons and according to the methods described hereinabove. The completion of these steps results in a functional NMOS or PMOS transistor.

In light of the foregoing explanation of source/drain extension regions and the impact of these designs on transistor performance, it will be appreciated that tight control over the depth of ion implantation and dopant concentration gradient is advantageous for semiconductor fabrication techniques. Such control is also desirable due to the trend of increasing miniaturization in electronic components, because shallower implant techniques may permit the use of thinner semiconductor wafers and the fabrication of smaller components. However, the source/drain extension regions must be designed not only to prevent electronic flow when the gate voltage is below the gate threshold, but also to permit electronic flow with low resistance when the gate voltage is above the gate threshold. This latter characteristic, known as sheet resistance, is a common metric of transistor performance.

It is always desirable to make further improvements in the area of semiconductor fabrication.

SUMMARY

The following presents a simplified summary of the disclosure in order to provide a basic understanding of some aspects of the disclosure. This summary is not an extensive overview of the disclosure. It is intended neither to identify key or critical elements of the disclosure nor to delineate the scope of the disclosure. Rather, its primary purpose is merely to present one or more concepts of the disclosure in a simplified form as a prelude to the more detailed description that is presented later.

As discussed hereinabove, the details of ion implantation and thermal activation method determine the performance characteristics of semiconductor components that rely on such techniques. The measurement of component performance is sheet resistance, where lower resistance of the channel during gate activation is desirable. Another measurement of component performance is freedom from short channel effects, in which the channel resistance is not sufficient to prevent electronic flow when the gate is deactivated. It has been discovered that with source/drain extensions that feature conventional dopants, such as arsenic and phosphorus, these goals are often in conflict. If the extension region doping is comparatively deep and/or heavy, sheet resistance is reduced, but short channel effects are present; and if the extension region doping is comparatively shallow and/or light, short channel effects are suppressed, but at the expense of an increase in sheet resistance.

It has been discovered that antimony is a useful n-type dopant with performance characteristics that may be more desirable for some uses than other dopants, such as arsenic and phosphorus. The chemical properties of antimony are especially suitable for its use as a dopant for a source/drain extension region. The present disclosure relates to methods of implanting antimony as an n-type dopant. Source/drain extension regions primarily comprised of antimony exhibit a lower sheet resistance, less diffusion, more abrupt junction gradient and hence greater conductance and higher transistor performance, than source/drain extension regions formed with other n-type dopants, such as phosphorus and antimony. This permits the formation of shallow source/drain regions that suppress short-channel effects, but that nevertheless exhibit a desirably low sheet resistance.

However, it has been further discovered that antimony is comparatively sensitive to high temperatures. This is noteworthy because the activation of the dopant ions is often performed by a high-temperature anneal. For instance, the thermal anneal that is often used to activate the source/drain region (subsequent to forming the source/drain extension region) is often performed at 1,000 to 1,100° C., and for a duration of 1.0 to 5.0 seconds. However, it has been discovered that antimony can be activated by a high-temperature, short-duration anneal, but is deactivated by further exposure to high temperatures. Therefore, the thermal anneal that is used for activating the source/drain region may also deactivate the antimony in the source/drain extension region. Instead, the antimony is more optimally activated with a shorter and hotter anneal, such as at 1,240° C. and for 0.8 milliseconds. Thus, in order to use antimony as an n-type dopant, the fabrication process is more optimally arranged so that the antimony implant is activated by a relatively high-temperature, short-duration activating anneal, and is subsequently protected from high temperatures.

The present disclosure utilizes these discoveries and relates to the implantation and activation of antimony as an n-type dopant through the use of a high-temperature, short-term anneal. The activation of this antimony dopant may be preserved by preventing exposure to high temperatures. This technique may be used for many purposes, but is particularly well-suited for the formation of an ultra-thin source/drain extension region in a semiconductor component, such as an NMOS transistor. The disclosure relates both to the techniques of implanting and activating antimony, and also to components featuring antimony implanted and activated in this manner.

The disclosure also relates to improvements of this technique and components created through such improved techniques. On such improvement features a more precise implanting of antimony through a preceding amorphization of the semiconductor substrate, such as by ion implantation of an amorphizer like germanium or silicon. Another improvement of this technique involves an angular implantation of antimony toward the gate structure. It will be appreciated that the source/drain region should laterally extend to underlap a portion of the gate, and some of this lateral extension occurs due to diffusion of the source/drain extension implant during the high-temperature anneal. This underlap positioning may be promoted by implanting the antimony at an angle toward the gate, so that some antimony is implanted underneath the gate. Still another improvement of this technique involves the inclusion of a sidewall spacer implanted over the source/drain extension region following antimony implantation and activation, where the sidewall spacer is created with a low thermal budget technique to preserve the activation of antimony.

To the accomplishment of the foregoing and related ends, the following description and annexed drawings set forth in detail certain illustrative aspects and implementations of the disclosure. These are indicative of but a few of the various ways in which one or more aspects of the present disclosure may be employed. Other aspects, advantages and novel features of the disclosure will become apparent from the following detailed description of the disclosure when considered in conjunction with the annexed drawings.

BRIEF DESCRIPTION OF THE DRAWINGS

FIG. 5 is a chart illustrating some advantages of an exemplary method of ion implantation in accordance with the present disclosure.

DETAILED DESCRIPTION

Figure 1:
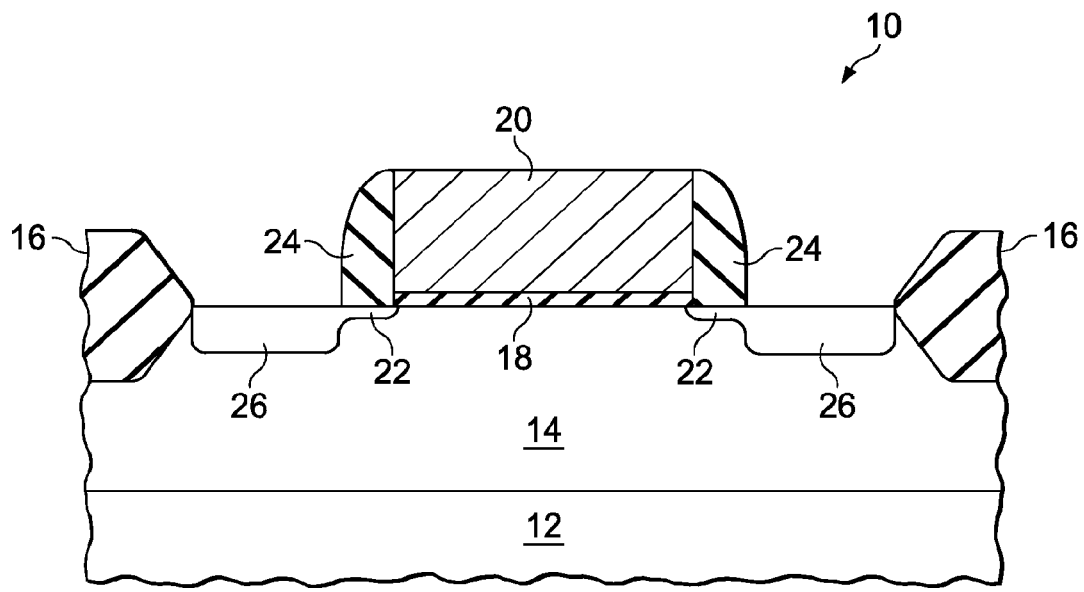
FIG. 1 is a side-elevation view in section illustrating a portion of a semiconductor substrate.

One or more aspects of the present disclosure are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present disclosure. It may be evident, however, to one skilled in the art that one or more aspects of the present disclosure may be practiced with a lesser degree of these specific details. In other instances, well-known structures and devices are shown in block diagram form in order to facilitate describing one or more aspects of the present disclosure.

As discussed hereinabove, the present disclosure relates to the implantation and activation of antimony as a semiconductor dopant, and includes methods of implanting and activating this dopant and components that incorporate this dopant and down-streaming process schemes to preserve the high dopant activation level. The present disclosure more specifically relates to the implantation and activation of antimony to form a source/drain extension region of a transistor in a semiconductor, and transistors that incorporate a source/drain extension region formed in this manner, and/or where at least one of the source extension region and the drain extension region is doped with activated antimony.

Figure 2:
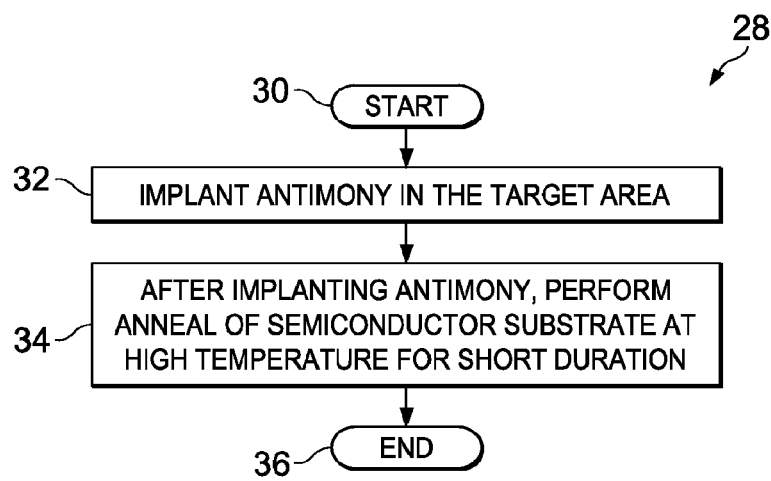
FIG. 2 is a flow diagram illustrating an exemplary method of ion implantation in accordance with the present disclosure.

Turning first to FIG. 2, the disclosure includes a method of implanting doping a target area of a semiconductor substrate with activated antimony. The method comprises implanting antimony in the target area, and subsequent to implanting antimony, performing an anneal of the semiconductor substrate at high temperature for a short duration.

It will be appreciated by those of ordinary skill in the art that the implantation of antimony ions may be performed by many conventional methods. One such method is via an ion beam generated by an ion implantation system, which fires ions of the dopant at the semiconductor substrate. The ion beam may be configured to comprise a variable density of ions (referred to as the current of the ion beam) that determines the rate of ion implanting, and with a variable voltage that determines the average depth of ion implanting. The ion beam may be scanned across the wafer to implant dopant ions in desired regions. The specificity of the ion implanting may be controlled to a limited extent, e.g., by masking areas of the substrate where implantation is not desired.

Dopant ions that are implanted in this manner often disrupt the silicon lattice structure of the silicon wafer. Moreover, the dopant ions often come to rest in areas of the silicon wafer that do not correspond to lattice points for the silicon matrix. As a result, the electronic conductance of the wafer is rendered unpredictable, and the dopant ions may be positioned in isolation of the electronic flow. In order to address both disadvantages, the semiconductor wafer is thermally annealed following the ion implantation, which both restores the atomic connections of the lattice structure, and causes the implanted ions to migrate toward lattice points in the matrix, where they are incorporated in the electronic flow of the semiconductor component. In the method of FIG. 2, the implanted antimony is exposed to a high-temperature, short duration anneal. Higher activation is achieved by causing solid-phase epitaxial regrowth of silicon on a short time scale that freezes in high non-equilibrium levels of solubility of antimony. The duration of the anneal is kept short in order to prevent deactivation of the antimony ions, as overexposure reduces the solubility of antimony in silicon at equilibrium states.

Figure 3:
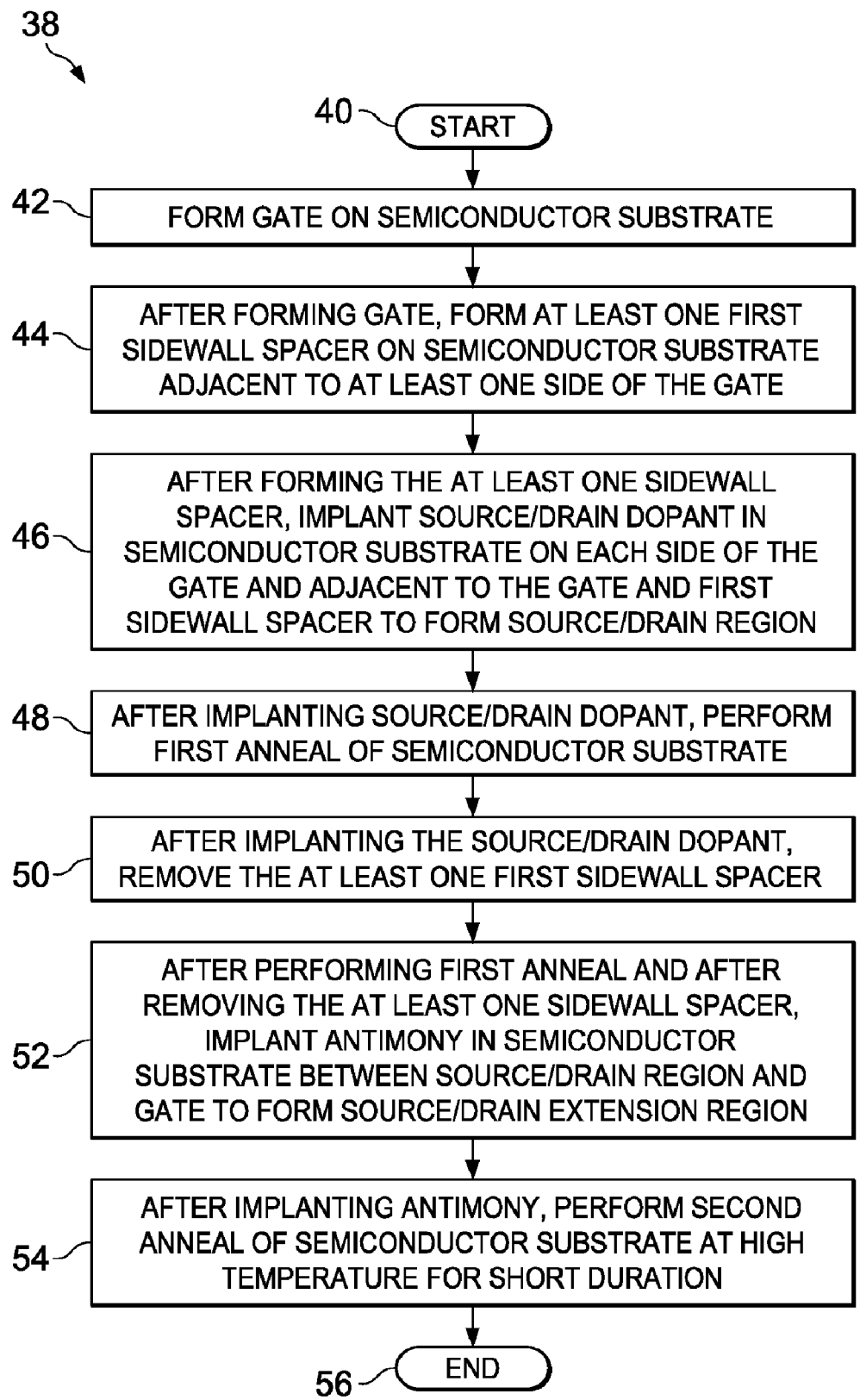
FIG. 3 is a flow diagram illustrating an exemplary method of forming a transistor in accordance with the present disclosure.

Turning next to FIG. 3, the disclosure includes a method of forming a transistor on a semiconductor substrate that incorporates the concepts disclosed herein. According to the conventions of semiconductor fabrication described hereinabove, the semiconductor substrate used in this method has preferably been doped with a dopant having opposite electronic properties as that desired for the transistor, e.g., a p-type doped region has been formed to support an NMOS transistor. Also, again as discussed hereinabove as per common convention, the semiconductor has preferably been electronically isolated from other regions, e.g., by the formation of LOCOS isolation structures or isolation trenches. The method 38 of FIG. 3 presupposes the provision of such a semiconductor substrate, and so begins at 40 by forming a gate on the semiconductor substrate 42. At 44, after forming the gate, the method suggests forming at least one first sidewall spacer on the semiconductor substrate adjacent to at least one side of the gate. The first sidewall spacer will likely be formed as having a width corresponding approximately to the desired length of the source/drain extension region that will be formed on this area of the semiconductor substrate. At 46, after forming the at least one first sidewall spacer, the method suggests implanting a source/drain dopant in the semiconductor substrate on each side of the gate and adjacent to the gate and first sidewall spacer. The area where the source/drain dopant is implanted will serve as the source/drain regions of the transistor. At 48, after implanting the source/drain dopant, the method suggests performing a first anneal of the semiconductor substrate. This first anneal serves to activate the dopant implanted to comprise the source/drain regions as discussed hereinabove. At 50, also after implanting the source/drain dopant, the method suggests removing the at least one sidewall spacer created at 44. Removing the sidewall spacer(s) will expose a portion of the semiconductor substrate between the source/drain regions and the gate structures, and this portion is intended to serve as the source/drain extension region. For each such area, at 52, after performing the first anneal and removing the at least one first sidewall spacer, the method suggests implanting antimony in the semiconductor substrate between the source/drain region and the gate to form the source/drain extension region. In accordance with conventional source/drain extension region designs, this doping is preferably lighter and shallower than the doping of the source/drain regions. At 54, after implanting antimony, the method suggests performing a second anneal of the semiconductor substrate at high temperature for a short duration. The second anneal serves to activate the antimony as discussed hereinabove. Upon the completion of these elements, the method ends at 56, wherein an operational transistor has been formed. Following this method, additional processing may occur as per conventional semiconductor fabrication techniques (e.g., the transistor may be coated in a layer of dielectric insulation, and/or the transistor may be subjected to backend processing and metallization that electronically connects the transistor to other components to form a fully interconnected circuit.)

It will be appreciated that the elements of the method illustrated in FIG. 3 are arranged such that the formation of the source/drain regions precedes the formation of the source/drain extension regions. This arrangement reverses the arrangements suggested by conventional methods, in which the source/drain extension region is formed before the source/drain region. The advantage of the arrangement suggested by the method illustrated in FIG. 3 is that the high-temperature anneal used to activate the source/drain region occurs prior to implantation of antimony, and thereby avoids the thermal deactivation of antimony from source/drain region activation. This "reverse source/drain formation" technique thereby facilitates the use of antimony as the dopant for the source/drain extension region of a transistor.

Figure 4A:
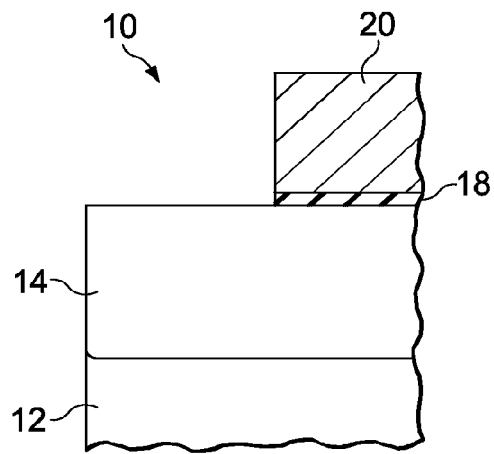
FIGS. 4A-4E are side-elevation views in section that together illustrate a transistor formed in accordance with the present disclosure.
Figure 4B:
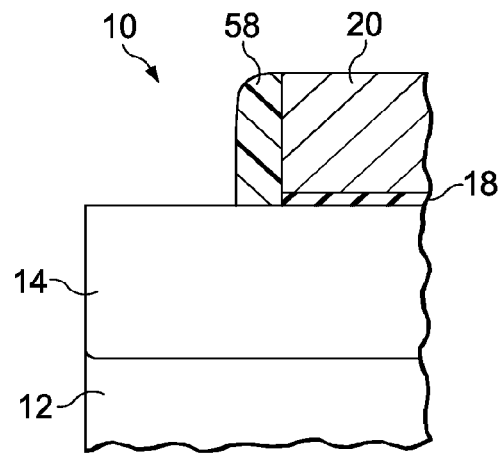
Figure 4C:
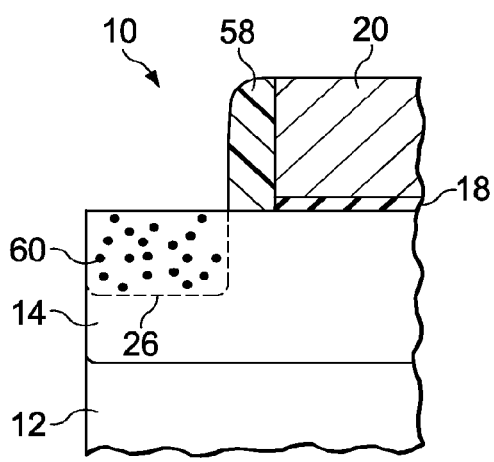
Figure 4D:
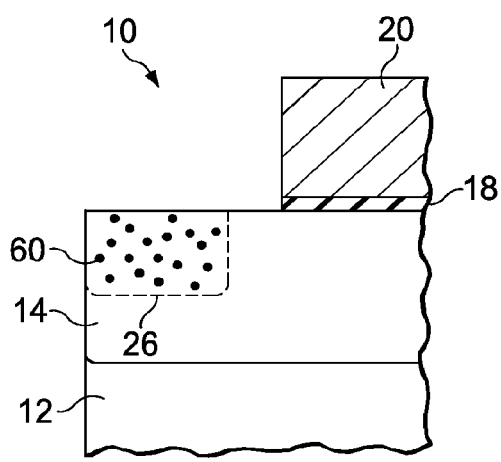
Figure 4E:
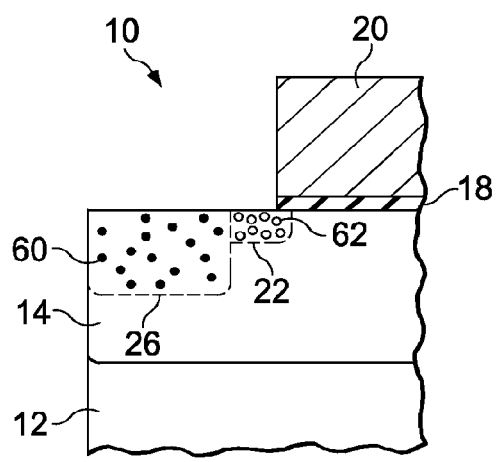

The method of FIG. 3 is illustrated in FIGS. 4A-4E, which comprises a set of side-elevation views in section of a transistor in various stages of fabrication according to a method disclosed herein. As discussed above, in each of these figures, the semiconductor 10 is presumed to comprise a semiconductor wafer 12, in which the semiconductor substrate 14 has been doped with a dopant having the opposite electronic properties of the components to be formed thereupon. FIG. 4A illustrates the result of 42 of FIG. 3, in which the gate is formed on the semiconductor substrate. As discussed hereinabove, the gate typically includes a thin dielectric layer 18 over which is formed a polysilicon layer 20. FIG. 4B illustrates the result of 44 of FIG. 3, in which a sidewall spacer 58 has been formed on the semiconductor substrate 14 and adjacent to the gate comprising the gate structures 18, 20. FIG. 4C illustrates the result of 46 of FIG. 3, in which a source/drain dopant 60 has been implanted in the semiconductor substrate 14 adjacent to the gate comprising gate structures 18, 20 and adjacent to the sidewall spacer 58, thereby forming a source/drain region 26. A similar process is carried out adjacent to the other side of the gate (not shown) and, if a first sidewall spacer is also formed on the other side of the gate, adjacent to that first sidewall spacer, in order to form the other source/drain region of the transistor. FIG. 4D illustrates the result of 50 of FIG. 3, in which the first sidewall spacer has been removed from the semiconductor substrate 14. This removal has exposed an area of the semiconductor substrate 14 between the gate comprising gate structures 20, 18 and the source/drain region 26 formed in 46 of FIG. 3. Finally, FIG. 4E illustrates the result of 52 of FIG. 3, in which antimony 62 has been implanted in the semiconductor substrate 14 between the source/drain region 26 and the gate comprising gate structures 18, 20 in order to form the source/drain extension region 22.

The disclosure suggests that antimony that has been implanted and activated according to the suggested methods exhibits advantageous electronic properties that are particularly well-suited for the doping of a source/drain extension region. An exemplary implant condition of the antimony is 2-10 keV with a dosage of $2 \times 10^{14}$-$1.5 \times 10^{15}$ atoms/cm$^2$. FIG. 5 illustrates the advantages in a chart that depicts the electronic properties of various dopants implanted and activated with various methods. In this chart 64, the X axis 66 represents junction depth ($X_j$), as measured in angstroms (A), and the Y axis 68 represents sheet resistance ($R_s$), as measured in ohms/cm$^2$. As noted hereinabove, for the purpose of forming a source/drain extension region, it is desirable to select a dopant that features low sheet resistance (low $R_s$) at a low (thin) junction depth ($X_j$). The chart 64 presents the measurements of these properties for an arsenic dopant 70, and for a phosphorus dopant 72. The multiple points in each data series represent variations on the implantation and activation techniques (e.g., laser thermal annealing; laser thermal annealing preceded by a 950° C. thermal spike; laser thermal annealing followed by a 950° C. thermal spike; and laser thermal annealing followed by a 1020° C. thermal spike.) For both arsenic dopants 70 and phosphorus dopants 72, an inverse relationship was noted between junction depth and sheet resistance. Neither dopant presented both low sheet resistance and low (thin) junction depth upon implantation and activation by any of these methods. Similarly, the third data series 74 presents the measurements of these properties for an antimony dopant that has been deactivated by exposure to a thermal spike (laser thermal annealing preceded by a 950° C. thermal spike; laser thermal annealing followed by a 950° C. thermal spike; and laser thermal annealing followed by a 1020° C. thermal spike.) In all such cases, the antimony dopant produced undesirable junction depth and resistance measurements, due to deactivation caused by the thermal spike. By contrast, the fourth data series 76 presents the measurement of these properties for an antimony dopant that has been exposed only to a high-temperature, short-duration anneal via a laser or arc lamp. This dopant outperforms all other measured dopants and implantation/activation methods by presenting a desirably low sheet resistance at a desirably low (thin) junction depth.

Having thus described and illustrated some methods and structures in accordance with the disclosure, some additional details of these methods will now be discussed. The thermal anneal used to activate the implanted antimony may be successfully implemented within a range of high temperatures and short durations, and may exhibit varying degrees of sheet resistance at various junction depths. It is suggested that one formulation of this anneal that yields desirable results is an anneal at approximately 1,240° C. and for approximately 0.8 milliseconds. It is also suggested that the thermal anneal of the antimony may be performed by any of several annealing techniques, including (without limitation) exposing the semiconductor substrate to a laser, or a flash lamp, or an arc lamp.

Another embodiment of the method in accordance with the present disclosure will now be discussed that features the advantage of enhanced precision of ion implanting of the antimony in the source/drain extension region. The precision of ion implanting may sometimes be reduced by the phenomenon of "channeling," in which the atoms of the silicon wafer are organized in such a regular pattern as to feature long "channeling" of space through portions of the crystalline lattice. These channeling may cause an undesirable imprecision during ion implantation. If an ion is fired at the silicon wafer with an angle and position corresponding to a tunnel, it may penetrate the wafer surface to a significantly greater depth before coming to rest in the wafer. Therefore, the presence of channeling in the silicon crystalline lattice may permit some ions to be implanted at a greater depth than would be expected based on the voltage of the ion beam, which reduces the depth precision of the ion implantation.

One technique for suppressing this imprecision is to eliminate the channeling by amorphizing the crystalline structure. In the methods disclosed above, the amorphizing of the intended source/drain extension region (the area of the semiconductor substrate between the gate and the source/drain region) may be performed after removing the first sidewall spacer(s) and prior to implanting antimony. One common way of performing this technique is by implanting an amorphizer that disrupts the regular lattice of the crystalline silicon wafer, thereby blocking many of the channeling in the lattice. This amorphization may be followed by an ion implantation of a desired dopant, which will no longer be rendered imprecise by the channeling effect. After the precision ion implant, the amorphization may be reversed by a thermal anneal, which restores the regular lattice pattern and also the electronic predictability of the component. If the amorphization is to be performed by an amorphizing ion implant, it is desirable to choose an amorphizer that will not alter the electronic properties of the electronically active area. Many substances are known to be suitable for this amorphizing task, including, e.g., germanium and silicon.

Figure 6A:
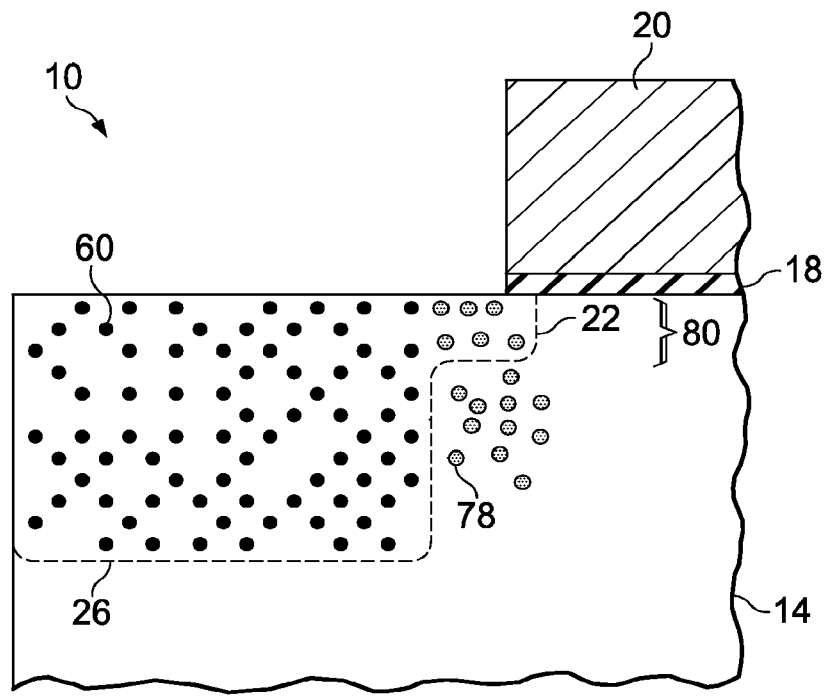
FIGS. 6A-6B are side-elevation views in section that together illustrate another transistor formed in accordance with the present disclosure.
Figure 6B:
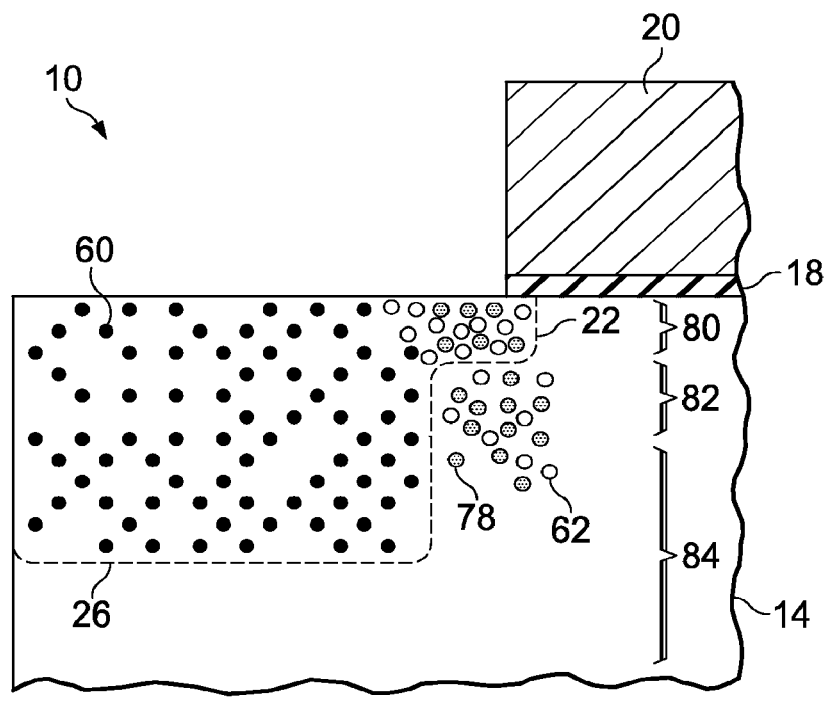

The present disclosure may incorporate this amorphization technique in order to increase the precision ion implanting of antimony in the source/drain extension region. One embodiment of this improved method is presented in FIGS. 6A-6B, both of which illustrate a side-elevation view in section of a portion of a transistor. In each of these figures, the semiconductor 10 comprises a silicon wafer having a semiconductor substrate 14 doped as discussed hereinabove. Each figure also illustrates a gate comprising a thin layer of dielectric material 18 over which is formed a polysilicon layer 20. Each figure also illustrates a source/drain region 26 comprising a region of the semiconductor substrate 14 that has been implanted with a source/drain dopant 60. For this set of figures, the feature of interest is the area 22 of the semiconductor substrate 14 between the source/drain region 26 and the gate comprising gate structures 18, 20, which is intended to serve as the source/drain extension region. In this embodiment, as illustrated in FIG. 6A, prior to implanting antimony, this area is implanted with an amorphizer 78, e.g., via ion implantation. As noted above, it is desirable to choose an amorphizer that does not alter the electronic properties of the source/drain extension region, and amorphizers comprising either germanium or silicon may be suitable. As illustrated in FIG. 6B, the area is then implanted with antimony 78 to form the source/drain extension region 22 and annealed to active the antimony, which also reverses the amorphization of the crystalline lattice of the semiconductor substrate 14. The advantageous result of this amorphization may be observed in FIG. 6B, in which the antimony 62 is shown to have implanted mainly in the shallowest portion 80 of the semiconductor substrate 14 that includes the source/drain extension region 22. It is known that during the thermal anneal, the antimony 62 may diffuse slightly out of the source/drain region, both laterally at the same depth 80 and also a bit deeper into the semiconductor substrate 82. However, the amorphizer 78 suppresses the tunnelling of the antimony 62 into the deeper portion 84 of the semiconductor substrate 14, thereby increasing the precision of the antimony ion implantation. For germanium, an exemplary set of implantation parameters is 20-40 keV with a dosage of $1\times10^{14}$-$5\times10^{14}$ atoms/cm$^2$; for silicon, an exemplary set of implantation parameters is 15-30 keV with a dosage of $1\times10^{14}$-$5\times10^{14}$ atoms/cm$^2$.

Still another embodiment of the method in accordance with the present disclosure will now be discussed that features the advantage of an enhanced underlap of the source/drain extension region with respect to the gate. One common but undesirable feature of transistors produced as described herein is an electrical capacitance between the gate and the source/drain regions that may reduce the switching speed of the transistor, thereby interfering with the performance of the transistor. One technique for suppressing this electrical capacitance is by forming the source/drain extension region so as to laterally underlap the gate by a small amount, which facilitates dissipation of the electrical capacitance and thereby improves transistor performance.

Figure 7:
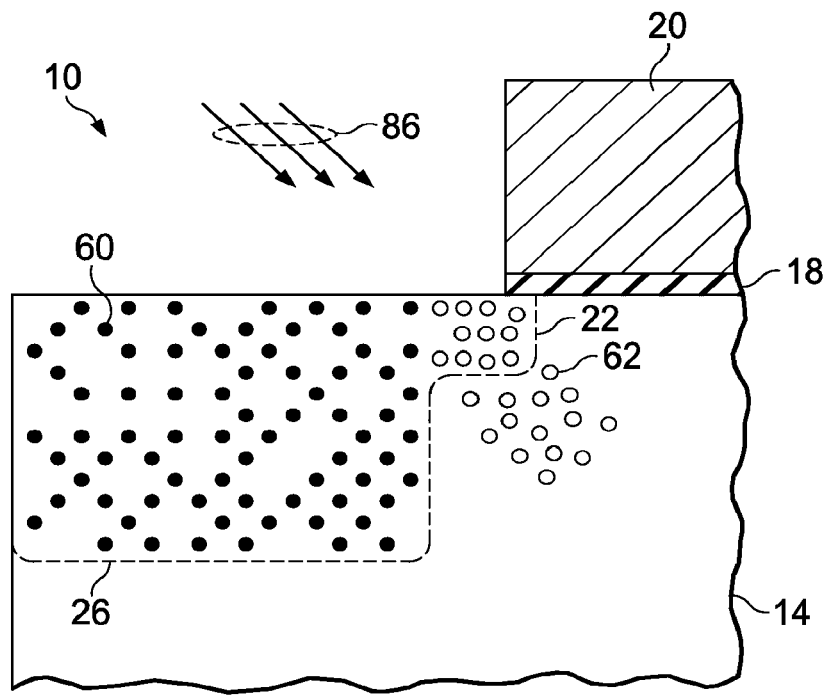
FIG. 7 is a side-elevation view in section illustrating yet another transistor formed in accordance with the present disclosure.

As noted and illustrated hereinabove, this underlap will naturally form to a limited extent due to lateral diffusion of the antimony out of the source/drain extension region during the activating thermal anneal. However, this underlap may be promoted in order to reduce electrical capacitance and thereby promote transistor performance. One embodiment of this improved method is presented in FIG. 7, which illustrates a side-elevation view in section of a portion of a transistor. In this figure, the semiconductor 10 comprises a silicon wafer having a semiconductor substrate 14 doped as discussed hereinabove. This figure also illustrates a gate comprising a thin layer of dielectric material 18 over which is formed a polysilicon layer 20. This figure also illustrates a source/drain region 26 comprising a region of the semiconductor substrate 14 that has been implanted with a source/drain dopant 60. For this figure, the feature of interest is the area 22 of the semiconductor substrate 14 between the source/drain region 26 and the gate comprising gate structures 18, 20, which is intended to serve as the source/drain extension region. As in other embodiments, this area is implanted with antimony 62 to form the source/drain extension region 22. However, in this embodiment, the implantation ion beam is directed at the semiconductor substrate 14 in a direction 86 having an angle greater than zero degrees with respect to the gate comprising gate structures 18, 20. By implanting the antimony 62 in a direction 86 having an angle greater than zero degrees with respect to the gate structures 18, 20, some of the antimony 62 will be implanted beneath the gate comprising gate structures 18, 20, thereby forming an enhanced source/drain extension underlap. The resulting transistor will be less susceptible to electrical capacitance between the gate and the source/drain regions, thereby increasing switching speed and transistor performance.

A final embodiment of the method in accordance with the present disclosure will now be discussed that features the advantage of re-forming the sidewall spacer after antimony doping to form the source/drain extension region. Some conventional designs of transistors rely on the presence of the sidewall spacer over the source/drain region. For instance, the thinly formed source/drain extension regions may be particularly susceptible to damage from subsequent etching processes, and metal shorting due to the silicidation process. The inclusion of a sidewall spacer over the source/drain extension region may shield the source/drain extension region from such etching and metal shorting. In the embodiments mentioned hereinabove, a first sidewall spacer is introduced in order to set the position of the source/drain region, but it is subsequently removed in order to permit the formation of the source/drain extension region. Another embodiment of this disclosure may incorporate this technique by forming at least one second, low thermal budget sidewall spacer over a source/drain extension region. In the methods discussed hereinabove, the second sidewall spacer may be formed after forming the source/drain extension region.

Figure 8:
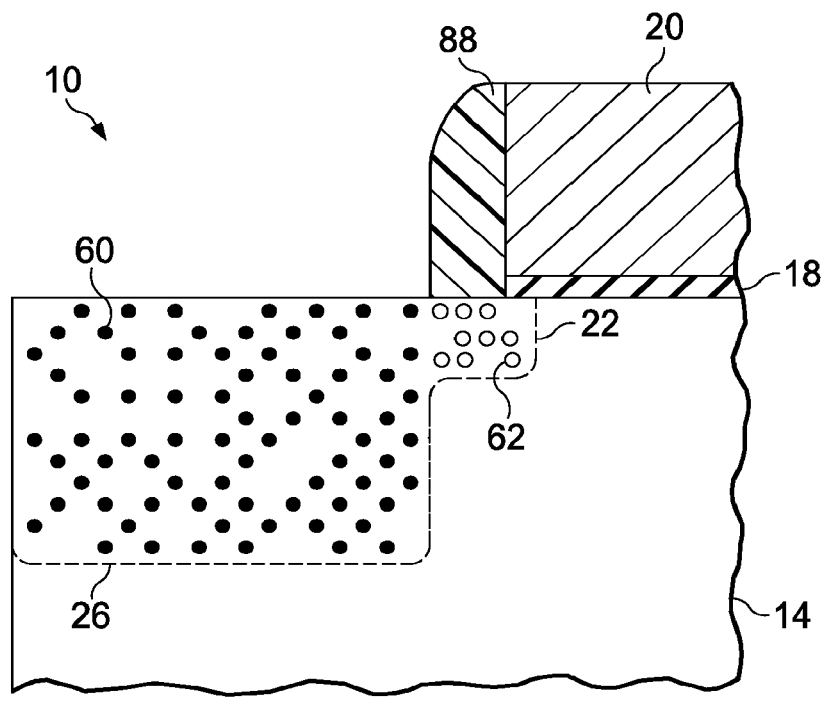
FIG. 8 is a side-elevation view in section illustrating yet another transistor formed in accordance with the present disclosure.

One embodiment of this improved method is presented in FIG. 8, which illustrates a side-elevation view in section of a portion of a transistor. In this figure, the semiconductor 10 comprises a silicon wafer having a semiconductor substrate 14 doped as discussed hereinabove. This figure also illustrates a gate comprising a thin layer of dielectric material 18 over which is formed a polysilicon layer 20. This figure also illustrates a source/drain region 26 comprising a region of the semiconductor substrate 14 that has been implanted with a source/drain dopant 60, and also a source/drain extension region 22 comprising a region of the semiconductor substrate 14 that has been implanted with antimony 62. For this figure, the feature of interest is the formation of a second sidewall spacer 88 subsequent to the implanting of antimony 62. It is suggested that the second sidewall spacer 88 should be formed with a low thermal budget technique, e.g. with techniques that do not exceed 600° C., so as to prevent the thermal deactivation of antimony 62. This can be achieved by using a plasma enhanced chemical deposition (PECVD) technique, or using specialized organic precursors, such as BTBAS or HCD, to lower the deposition temperature. It will be appreciated by persons having ordinary skill in the art that many techniques are available for forming the second sidewall spacer in accordance with this low thermal budget. The embodiment so illustrated thereby re-forms the sidewall spacer in order to protect the source/drain extension region, with the advantages suggested hereinabove.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of forming a transistor on a semiconductor substrate, the method comprising:
   forming a gate on the semiconductor substrate;
   after forming the gate, forming at least one first sidewall spacer on the semiconductor substrate adjacent to at least one side of the gate;
   after forming the at least one first sidewall spacer, implanting a source/drain dopant in the semiconductor substrate on each side of the gate and adjacent to the gate and first sidewall spacer to form a source region and a drain region;
   after implanting the source/drain dopant, performing a first anneal of the semiconductor substrate to activate the source/drain dopant;
   after implanting the source/drain dopant, removing the at least one first sidewall spacer;
   after performing the first anneal and after removing the at least one first sidewall spacer, implanting antimony in the semiconductor substrate between the source/drain region and the gate to form a source/drain extension region; and
   after implanting antimony, performing a second anneal of the semiconductor substrate to activate the antimony implant; the second anneal being conducted at a temperature within a range of approximately 1100° C. to 1400° C. for a time duration on the order of a tenth of a millisecond to approximately one millisecond.

2. The method of claim 1, wherein the temperature of the second anneal is approximately 1,240 degrees Celsius, and the duration of the second anneal is approximately 0.8 milliseconds.

3. The method of claim 1, wherein the antimony is implanted at 2-10 keV with a dosage of $2 \times 10^{14}$-$1.5 \times 10^{15}$ atoms/cm$^2$.

4. The method of claim 1, wherein the second anneal is performed by heating the semiconductor substrate with at least one of a laser, a flash lamp, or an arc lamp.

5. The method of claim 1, further comprising, after removing the at least one sidewall spacer and prior to implanting antimony, amorphizing the semiconductor substrate between the source/drain region and the gate.

6. The method of claim 5, wherein the amorphizing comprises implanting at least one of germanium or silicon.

7. The method of claim 6, wherein the amorphizing comprises at least one of implanting germanium at 20-40 keV with a dosage of $1 \times 10^{14}$-$5 \times 10^{14}$ atoms/cm$^2$ or implanting silicon at 15-30 keV with a dosage of $2 \times 10^{14}$-$1 \times 10^{15}$ atoms/cm$^2$.

8. The method of claim 1, wherein the antimony is implanted at an angle greater than zero degrees in the direction of the gate.

9. The method of claim 1, further comprising, subsequent to forming the source/drain extension region, forming at least one second sidewall spacer over a source/drain extension region at a temperature of less than 600° C.

10. A transistor on a semiconductor substrate formed according to the method comprising:
    forming a gate on the semiconductor substrate;
    after forming the gate, forming at least one first sidewall spacer on the semiconductor substrate adjacent to at least one side of the gate;
    after forming the at least one first sidewall spacer, implanting a source/drain dopant in the semiconductor substrate on each side of the gate and adjacent to the gate and first sidewall spacer to form a source region and a drain region;
    after implanting the source/drain dopant, performing a first anneal of the semiconductor substrate to activate the source/drain dopant;
    after implanting the source/drain dopant, removing the at least one first sidewall spacer;
    after performing the first anneal and after removing the at least one first sidewall spacer, implanting antimony in the semiconductor substrate between the source/drain region and the gate to form a source/drain extension region; and
    after implanting antimony, performing a second anneal of the semiconductor substrate to activate the antimony implant; the second anneal being conducted at a temperature within a range of approximately 1100° C. to 1400° C. for a time duration on the order of a tenth of a millisecond to approximately one millisecond.

11. A method of forming a semiconductor device, comprising:
    forming a gate on a semiconductor substrate;
    forming sidewall spacers on sides of the gate;
    performing a first implant to form source/drain regions in the semiconductor substrate adjacent the sidewall spacers;
    after the first implant, performing a first anneal to activate dopant implanted in the first implant;
    after the first implant, removing the sidewall spacers;

after the first anneal and after removing the sidewall spacers, performing a second implant to form source/drain extension regions adjacent the gate; the second implant including implanting antimony in the substrate at least between the source/drain regions and a part of the gate;

after the second implant, performing a second anneal to activate the antimony implanted in the second implant; the second anneal being conducted at a temperature within a range of approximately 1100° C. to 1400° C. for a time duration on the order of a tenth of a millisecond to approximately one millisecond.

12. The method of claim 11, wherein the second anneal is conducted using a laser, a flash lamp or an arc lamp.

13. The method of claim 11, wherein the second anneal is conducted at a temperature within a range of 1200° C. to 1350° C.

14. The method of claim 11, further comprising prior to performing the second implant, performing another implant to amorphize the substrate to a depth that will include the subsequent antimony implant.

15. The method of claim 14, wherein the another implant includes implanting the substrate with at least one of silicon or germanium.

16. The method of claim 15, wherein the another implant includes implanting germanium at an energy of 5 keV to a dose of $2 \times 10^{14}$ atoms/cm$^2$; the second implant includes implanting antimony at an energy of 5 keV to a dose of $5 \times 10^{14}$ atoms/cm$^2$; and the second anneal includes annealing to a peak temperature of approximately 1240° C. for a time duration of 0.8 millisecond.

17. The method of claim 11, further comprising after the second implant, forming a another sidewall spacer on the sides of the gate.

18. The method of claim 17, wherein the another sidewall spacer is a silicide spacer.

19. The method of claim 17, wherein the another spacer is formed at less than 600° C.

20. The method of claim 19, further comprising additional back end of line processing to complete the device at less than 600° C.

21. The method of claim 11, further comprising forming an offset spacer on the sides of the gate prior to the second implant.

22. The method of claim 21, wherein the second implant is an angled implant and includes implanting antimony laterally undercutting the gate.

23. The method of claim 11, wherein the second implant is an angled implant and includes implanting antimony laterally undercutting the gate.

* * * * *